United States Patent [19]

Small

[11] 4,110,598
[45] Aug. 29, 1978

[54] THERMAL PRINTHEAD ASSEMBLY

[75] Inventor: Richard B. Small, Dallas, Tex.

[73] Assignee: Texas Instruments Incorporated, Dallas, Tex.

[21] Appl. No.: 789,462

[22] Filed: Apr. 21, 1977

Related U.S. Application Data

[60] Continuation of Ser. No. 609,655, Sep. 2, 1975, abandoned, which is a continuation of Ser. No. 363,432, May 24, 1973, abandoned, which is a division of Ser. No. 52,320, Jul. 6, 1970, Pat. No. 3,750,269.

[51] Int. Cl.² .............................................. H05B 1/00
[52] U.S. Cl. .................................... 219/216; 219/543; 346/76 R
[58] Field of Search .................. 219/216, 543; 346/76; 357/56; 29/580, 591

[56] References Cited
U.S. PATENT DOCUMENTS

| 3,632,969 | 1/1972 | Walkow | 219/216 |
| 3,700,852 | 10/1972 | Ruggiero | 219/543 |

Primary Examiner—C. L. Albritton
Attorney, Agent, or Firm—Rene' E. Grossman; James T. Comfort; Stephen B. Goldman

[57] ABSTRACT

In a method of mounting electronic devices, a gold lead is connected to each contact pad of each wafer in a semiconductor slice. In a parallel step, a body of wafer receiving material is secured to a support and is thereafter separated into wafer receiving members. Then, a layer of epoxy resin is applied to the slice, and the slice is secured to the wafer receiving members with each wafer mounted on a wafer receiving member and with the gold leads positioned between the wafers and the wafer receiving members. After the mounting step, the wafers comprising the slice are separated and the wafer receiving members are disengaged from the support. The resulting wafer-wafer receiving member subassemblies are subsequently fabricated into thermal printheads by mounting the wafer receiving members on heat sinks and connecting electrical conductors to the gold leads.

8 Claims, 10 Drawing Figures

THERMAL PRINTHEAD ASSEMBLY

This application is a continuation of application Ser. No. 609,655, filed 2 Sept. 1975, now abandoned, which is a continuation of application Ser. No. 363,432, filed 24 May 1973 now abandoned, which is a division of application Ser. No. 052,320, filed 6 July 1970, now U.S. Pat. No. 3,750,269, issued 7 Aug. 1973.

This invention relates to a method of mounting electronic devices, and more particularly to a method of mounting integrated circuit wafers of the type employed in thermal printheads.

U.S. Pat. No. 3,501,615 granted Mar. 17, 1970 to Merryman et al. and assigned to the assignee of the present application relates to a semiconductor wafer comprising an integrated heater element array and drive matrix. Wafers constructed in accordance with the Merryman et al. invention include an array of semiconductor mesas each comprising a heater element. The semiconductor mesas are selectively energized to form a pattern of "hot spots" having the shape of a desired character. The heated semiconductor mesas in turn activate a thermally sensitive material on which a dynamic display is formed or on which a permanent display is printed.

As is typical in the semiconductor industry, integrated circuit wafers employing the Merryman et al invention are manufactured in the form of semiconductor slices each including a multiplicity of individual wafers. Upon completion, the wafers are mounted on wafer receiving members, and the resulting wafer-wafer receiving member subassemblies are fabricated into thermal printheads by mounting the wafer receiving members on heat sinks and connecting electrical conductors to the wafers. Heretofore, the wafers have been separated upon completion and have been mounted on the wafer receiving members on an individual wafer basis. This procedure is unsatisfactory in that it involves a number of time consuming and costly steps.

The present invention comprises a method of mounting electronic devices in which all of the wafers in a slice are mounted on wafer receiving members simultaneously. In accordance with the preferred embodiment of the invention, leads are formed on the bonding pads of the wafers of a slice, and the slice is mounted on a plurality of wafer receiving members with the leads positioned between the wafers and the wafer receiving members. This is preferably accomplished by securing the slice to the wafer receiving members with an adhesive while the wafer receiving members are secured to a support. After the slice is mounted, the wafers comprising the slice are separated and the wafer receiving members are disengaged from the support. The resulting wafer-wafer receiving member subassemblies are then fabricated into thermal printheads.

A more complete understanding of the invention may be had by referring to the following detailed description when taken in conjunction with the drawings, wherein.

Figure 1:
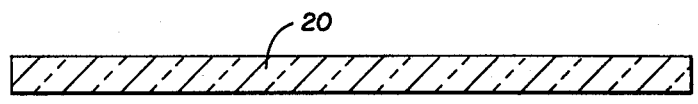
FIG. 1 is an illustration of a semiconductor slice comprising a multiplicity of integrated circuit wafers.

Referring now to the drawings, a method of mounting electronic devices employing the present invention is shown. Referring particularly to FIG. 1, there is shown a semiconductor slice 20 that has been fabricated in accordance with the above-identified Merryman et al invention to form a multiplicity of individual integrated circuit wafers. Each integrated circuit wafer of the slice 20 includes an array of heater elements which comprise semiconductor mesas, and a plurality of bonding pads which are located on the lower surface of the slice 20. The bonding pads of each wafer of the slice 20 are connected to the heater elements of the wafer through circuitry contained in the wafer.

In the practice of the present invention, a lead is formed on each bonding pad of each integrated circuit wafer comprising the semiconductor slice 20. The leads are preferably formed by means of one of the metalizing processes commonly employed in the semiconductor industry. In accordance with one such process, leads are formed on the bonding pads of the wafers comprising the slice 20 by coating the lower surface of the slice 20 with a layer of one of the commercially available photoresist compositions, exposing the coated surface through an opaque mask, and then developing the exposed photoresist layer to provide access to the bonding pads. A thin layer of gold is then applied to the lower surface of the slice, and the gold layer is coated with a second photoresist layer. The second photoresist is exposed through a mask and is developed to provide access to the gold layer.

Figure 2:
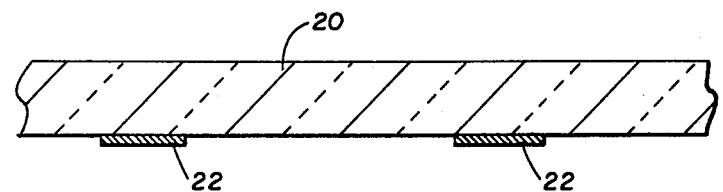
FIG. 2 is an illustration of an initial step in a method of mounting electronic devices employing the invention in which leads are formed on the bonding pads of the wafers comprising the slice.

When the second photoresist layer has been developed, the gold layer is employed as an electrode in a conventional electroplating system. In accordance with the preferred embodiment of the invention, the electroplating system is utilized to form a multiplicity of gold leads each having a thickness of about 0.0005 inches and each forming an electrical connection to one of the bonding pads of one of the wafers comprising the slice 20. It will be understood, however, that leads comprising various electrically conductive materials and having various thicknesses can be formed on the slice 20, if desired. After the leads are formed, the two photoresist layers and the portions of gold layer that are not covered by the leads are stripped from the slice. This step is preferably accomplished in accordance with one of the stripping techniques commonly employed in the semiconductor industry. The result of the foregoing procedure is illustrated in FIG. 2, wherein gold leads 22 are shown mounted on the lower surface of the slice 20.

Figure 3:
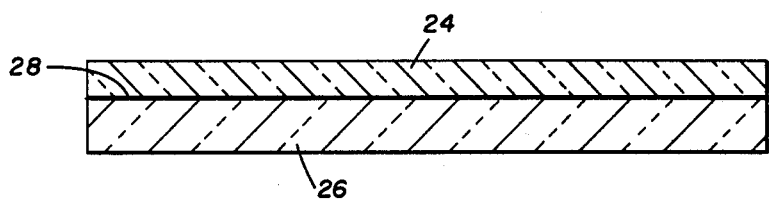
FIG. 3 is a sectional view showing the body of wafer receiving material secured to a support.

Referring now to FIG. 3, a body of wafer receiving material 24 is shown secured to a support 26 by an adhesive layer 28. The body of wafer receiving material 24 preferably comprises a material that has high electrical resistivity, high thermal conductivity, and high mechanical rigidity. For example, the body of wafer receiving material 24 may be comprised of alumina (AL- $_2O_3$). The support 26 may comprise any suitable material, for example, glass. The adhesive layer 28 preferably comprises a soluble adhesive having a relatively high melting temperature. For example, the adhesive layer 28 may be comprised of any of the commercially available waxes that melt at about 100° C.

Figure 4:
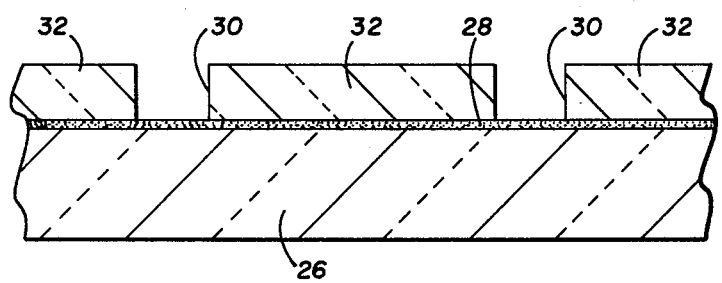
FIGS. 4 and 5 are illustrations of the steps in the method of mounting electronic devices in which the body of wafer receiving material is separated into individual wafer receiving members.
Figure 5:
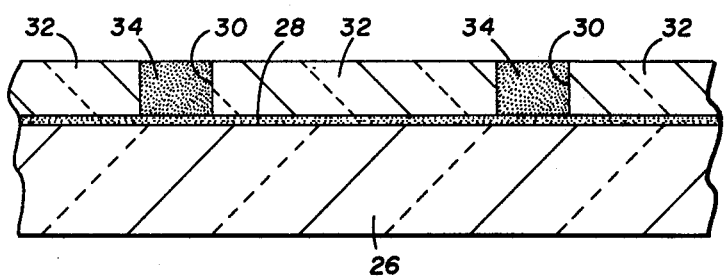

Referring now to FIGS. 4 and 5, a plurality of slots 30 are formed through the body of wafer receiving material 24 by a diamond saw. This separates the body of wafer receiving material 24 into a plurality of wafer receiving members 32, all of which are secured to the support 26 by the adhesive layer 28. The slots 30 are then filled with a soluble material 34 having a melting temperature below that of the adhesive layer 28. For example, the soluble material 34 may comprise any of the commercially available waxes that melt at about 70° C.

Figure 6:
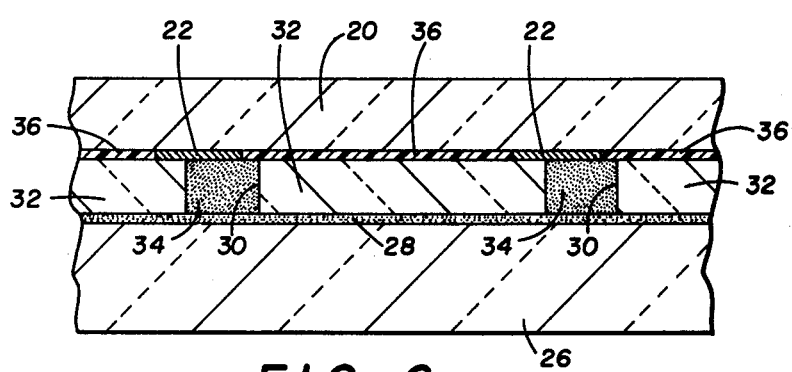
FIG. 6 is an illustration of a step in the method in which the semiconductor slice is mounted on the wafer receiving members.

Referring now to FIG. 6, a layer of adhesive 36 is formed on the lower surface of the slice 20, and the slice 20 is then mounted on the upper surfaces of the wafer receiving members 32. After the slice 20 is mounted on the wafer receiving members 32, the slice 20 is aligned with the wafer receiving members 32 until each wafer comprising the slice 20 is mounted on one of the wafer receiving members 32. This positions the gold leads 22 between the slice 20 and the wafer receiving members 32, and in alignment with the slots 30.

The layer of adhesive material 36 preferably comprises a thermosetting material that is resistant to solvent attack, that has good mechanical strength, and that has high heat conductivity. For example, various commercially available epoxy resins may be employed to form the adhesive layer 36. The thickness of adhesive layer 36 is preferably approximately equal to the thickness of the gold leads 22, however, it will be understood that it is not necessary for the gold lead 22 to contact the wafer receiving members 32. Thus, in a particular circumstance, the layer 36 may be of greater thickness than the gold lead 22.

Assuming that the adhesive layer 36 comprises an epoxy resin, the epoxy is cured. This is preferably accomplished at a temperature below the melting temperature of the adhesive layer 28, so that the alignment of the slice 20 and the wafer receiving members 32 is maintained. The upper surface of the slice 20 is then ground and/or etched until the total thickness of the slice 20 is about 0.002 inches. When the thickness of the slice has been reduced by the desired amount, the upper surface of the slice is coated with one of the commercially available photoresist compositions, is exposed through a mask, and is developed to provide access to the periphery of each semiconductor mesa of each wafer comprising the slice 20. Then, the upper surface of the slice 20 is etched to electrically isolate each semiconductor meas of each wafer comprising the slice. Various commercially available etching solutions can be employed to isolate the semiconductor mesas, depending upon the composition of the slice 20.

Figure 7:
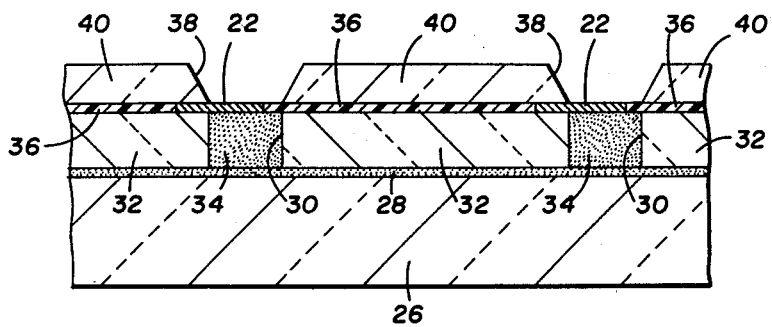
FIG. 7 is an illustration of a step in the method in which the wafers comprising the slice are separated.

When the semiconductor mesas of the various wafers have been isolated, the photoresist layer that was employed in the isolation of the semiconductor mesas is stripped from the upper surface of the slice 20, and another photoresist layer is applied thereto. The second photoresist layer is exposed through a mask and is developed to provide access to the border areas surrounding each wafer comprising the slice. As is best shown in FIG. 7, the border areas are then etched to form valleys 38.

The valleys 38 divide the slice 20 into a plurality of individual wafers 40, each of which is secured to one of the wafer receiving members 32 by a portion of the adhesive layer 36. As is clearly shown in FIG. 7, the separation etch step also exposes the protruding portions of the gold leads 22. The etching solution does not, however, attack the adhesive layer 36, the adhesive layer 28 or the soluble material 34.

When the slice 20 has been separated into individual wafers, the adhesive layer 28 and the soluble material 34 are removed. In a suitable case, this step may be accomplished by immersing the structure illustrated in FIG. 7 in a solvent bath that dissolves both the layer 28 and the soluble material 34. Alternatively, if the adhesive layer 28 and the soluble material 34 do not readily dissolve in the same solvent, the assembly shown in FIG. 7 may be sequentially immersed in different solvents. In either event, as the layer 28 and the solvent material 34 are dissolved, the wafer receiving members 32 become disengaged from the support 26 and from one another.

Figure 8:
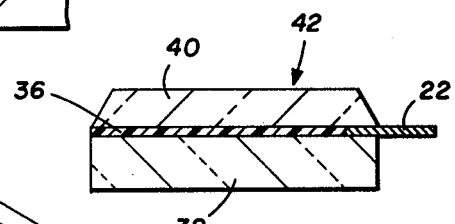
FIGS. 8 and 9 are sectional and enlarged perspective views, respectively, showing a wafer-wafer receiving member subassembly.
Figure 9:
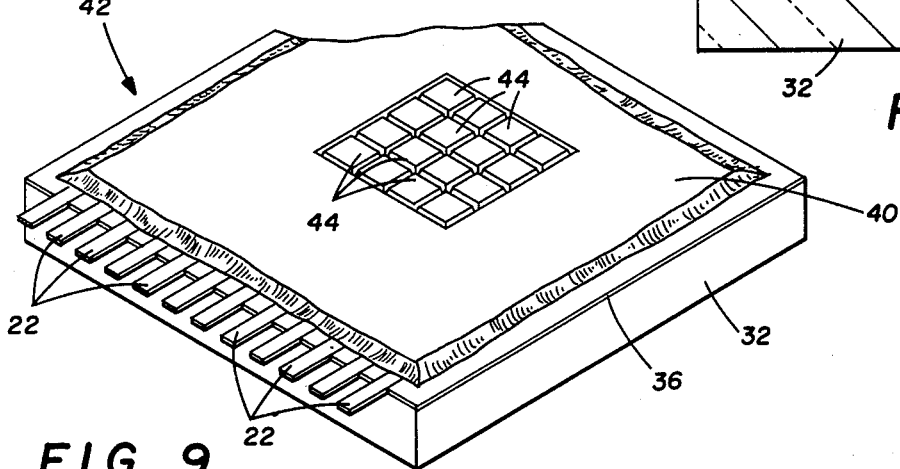

Referring now to FIGS. 8 and 9, the process steps illustrated in FIGS. 1–7 result in a subassembly 42 comprising a wafer 40 secured to a wafer receiving member 32 by a portion of the adhesive layer 36. The subassembly 42 further includes the gold leads 22, which are positioned between the wafer 40 and the wafer receiving member 32, and which extend outwardly, therefrom. As is best shown in FIG. 9, the wafer 40 of the subassembly 42 includes a plurality of electrically isolated semiconductor mesas 44. The semiconductor mesas 44 of the wafer 40 comprise the heater elements thereof.

Figure 10:
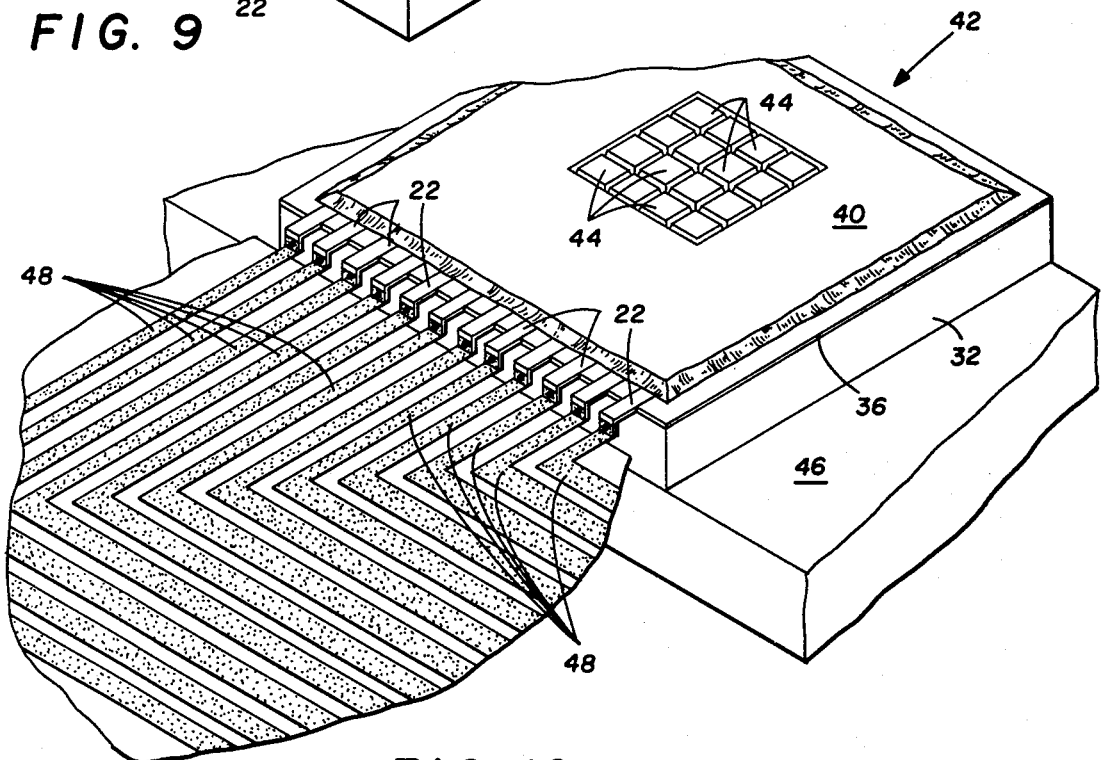
FIG. 10 is a perspective view of a thermal printhead incorporating the subassembly shown in FIGS. 8 and 9.

Referring now to FIG. 10, the gold leads 22 of the subassembly 42 are bent downwardly, that is, away from the upper surface of the wafer 40. Then, the subassembly 42 is secured to a heat sink 46, such as an aluminum strip, by a suitable adhesive, such as an epoxy resin. Finally, a conductor 48 is secured to each gold lead 22 of the subassembly 42. The conductors 48 may comprise any convenient construction, such as ribbon cable, and may be secured to the gold leads 22 by any convenient method, such as soldering.

The overall assembly including the assembly 42, the heat sink 46 and the conductors 48 comprises a thermal printhead. Thermal printheads of the type shown in FIG. 10 are useful in tthermal printers, such as the various thermal printers disclosed in the copending application entitled "ELECTRONIC PRINTHEAD PROTECTION", Ser. No. 823,127, Filed May 8, 1969, and assigned to the assignee of the present application. Of course, the subassembly shown in FIG. 9 can be used in thermal printhead constructions other than that shown in FIG. 10 and can be employed in applications other than thermal printers, if desired.

From the foregoing, it will be understood that the present invention comprises a method of mounting semiconductors in which all of the wafers of a slice are mounted on wafer receiving members simultaneously. The use of the invention is advantageous over the prior art in that it eliminates many costly and time consuming steps that are necessary when wafers are mounted individually. The invention is particularly adapted to the economical fabrication of wafer-wafer receiving member subassemblies of the type used in thermal printheads.

Although a specific embodiment of the invention has been illustrated in the drawings and described herein, it will be understood that the invention is not limited to the embodiment disclosed, but is capable of rearrangement, modification and substitution of parts and elements without departing from the spirit of the invention.

What is claimed is:

1. A thermal printhead assembly comprising:
   a semiconductor wafer having a plurality of semiconductor heater elements therein including bonding pads positioned on one side thereof,
   a wafer receiving member secured to one surface of said semiconductor wafer; and
   a plurality of heater element leads mounted between said semiconductor wafer and said wafer receiving member and extending outwardly therefrom, said heater element leads being connected to said bonding pads and terminating beyond the periphery of said semiconductor wafer providing means for connecting electrical conductors thereto.

2. A thermal printhead assembly according to claim 1 further including a heat sink for supporting said wafer receiving member.

3. A thermal printhead assembly according to claim 1 wherein said heater element leads are angular in shape and include portions that extend away from said semiconductor wafer.

4. A thermal printhead assembly comprising:
   a semiconductor wafer having a plurality of semiconductor heater elements therein including bonding pads positioned on one side thereof,
   a wafer receiving member secured to one surface of said semiconductor wafer,
   a plurality of heater element leads mounted between said semiconductor wafer and said wafer receiving member and extending outwardly therefrom, said heater element leads being connected to said bonding pads and terminating beyond the periphery of said semiconductor wafer providing means for connecting electrical conductors thereto,
   a first substrate region underlying said wafer receiving member for support thereof, and
   a second substrate region having a conductive metal pattern overlying said second substrate region, said conductive metal pattern providing means for electrically contacting the portions of said heater element leads extending outwardly from said semiconductor wafer and said wafer receiving member.

5. A thermal printhead assembly according to claim 4 wherein said conductive metal pattern overlying said second substrate region is subadjacent to said one surface of said semiconductor wafer.

6. A semiconductor thermal printing module of the type to be utilized in conjunction with thermally sensitive recording material for recording a form of information on said recording material, said module comprising:
   a first supporting substrate having a principal surface thereof;
   a semiconductor thermal printhead body having two major opposite faces, said semiconductor printhead body being mounted to said principal surface of said supporting substrate at one of said two major faces;
   said printhead body further including a region of a semiconductor wafer having an array of heater elements provided by discrete portions of said semiconductor wafer which are physically separated along the other major face of said printhead body, select ones of said heater elements, when energized, define said form of information, said elements having heat dissipative means respectively disposed therein at said one major face;
   an insulative layer of material at said one major face adherent to, and integrally joining said thermal printhead body;
   conductive means having major portions thereof positioned on said one major face for electrically interconnecting said heat dissipative means of said array, said conductive means further including bonding pads portions on said one major face;
   a plurality of heater element leads mounted between said first supporting substrate and said one major face of said printhead body and extending outwardly therefrom, said heater element leads connected to said bonding pads and terminating beyond the periphery of said printhead body; and
   means for providing electrical signals to said array of heat elements, said means comprising a metallized pattern disposed on a second supporting substrate, the metallized pattern extending from a location immediately adjacent said printhead body to a location remote from said printhead body, the portion of said metallized pattern adjacent said printhead body directly contacting said heater element leads at said adjacent location.

7. The semiconductor thermal printing module of claim 6 further including a metallic heat sink supporting said first substrate region.

8. The semiconductor thermal printing module of claim 6 wherein said adjacent location where said heater element leads contacts said metallized pattern is subjacent said one major surface.

* * * * *